(12) United States Patent
Sekine et al.

(10) Patent No.: US 8,569,632 B2
(45) Date of Patent: Oct. 29, 2013

(54) WIRING BOARD HAVING THROUGH HOLE OR NON-THROUGH HOLE, AND METHOD FOR PRODUCING THE SAME

(75) Inventors: Shigenobu Sekine, Tokyo (JP); Yurina Sekine, Tokyo (JP)

(73) Assignee: Napra Co., Ltd., Tokyo (JP)

( * ) Notice: Subject to any disclaimer, the term of this patent is extended or adjusted under 35 U.S.C. 154(b) by 1138 days.

(21) Appl. No.: 11/580,871

(22) Filed: Oct. 16, 2006

(65) Prior Publication Data
US 2008/0095926 A1 Apr. 24, 2008

(51) Int. Cl.
*H05K 1/11* (2006.01)

(52) U.S. Cl.
USPC .............................. 174/264; 174/262; 257/698

(58) Field of Classification Search
USPC .................................................. 174/261–266
See application file for complete search history.

(56) References Cited

U.S. PATENT DOCUMENTS

| | | | |
|---|---|---|---|
| 6,808,568 B2 | 10/2004 | Sekine | |
| 6,943,108 B2 * | 9/2005 | Farooq et al. | 438/667 |
| 7,091,589 B2 * | 8/2006 | Mori et al. | 257/686 |
| 7,425,299 B2 * | 9/2008 | Kato et al. | 420/560 |
| 7,425,765 B2 * | 9/2008 | Kitajima et al. | 257/772 |
| 7,565,739 B2 * | 7/2009 | Kitajima et al. | 29/852 |
| 2002/0187689 A1 * | 12/2002 | Suetsugu et al. | 439/874 |
| 2004/0253474 A1 * | 12/2004 | Akamatsu et al. | 428/615 |
| 2005/0110509 A1 * | 5/2005 | Maruyama et al. | 324/754 |
| 2006/0024943 A1 * | 2/2006 | Kang et al. | 438/612 |
| 2006/0037991 A1 * | 2/2006 | Negishi et al. | 228/104 |
| 2006/0043154 A1 * | 3/2006 | Kirby et al. | 228/37 |
| 2006/0131728 A1 * | 6/2006 | Salmon | 257/698 |

FOREIGN PATENT DOCUMENTS

JP H11-298138 10/1999

* cited by examiner

*Primary Examiner* — Ishwarbhai Patel

(74) *Attorney, Agent, or Firm* — Westerman, Hattori, Daniels & Adrian, LLP

(57) ABSTRACT

There is provided a circuit board including a substrate having a hole. Inside the hole, a metal wiring is formed. The wiring is made of a solder alloy having a melting point of 100 to 600° C., and the metal wiring includes a polycrystalline region of the solder alloy. The metal wiring of the present invention is superior in conductivity.

8 Claims, 11 Drawing Sheets

WIRING BOARD HAVING THROUGH HOLE OR NON-THROUGH HOLE, AND METHOD FOR PRODUCING THE SAME

BACKGROUND OF THE INVENTION

1. Field of the Invention

The present invention relates to a wiring board having a through hole and/or a non-through hole in which a metal wiring is formed. The metal wiring is made from spherical particles having a sphericity of about −10% to +10%. The spherical particles of the present invention can have a composite structure. The present invention also relates to a method for producing the wiring board.

2. Description of the Related Art

In order to form a metal wiring inside a through hole or a non-through hole, it was conventional to fill a conductive paste into a through hole or a non-through hole. Japanese Unexamined Patent Publication No. 11-298138 discloses a method for filling a viscosity paste into a through hole or a non-through hole for preparing a multilayer circuit board.

However, the invention disclosed by Japanese Unexamined Patent Publication No. 11-298138 can form a conductive wiring inside a hole whose diameter is as small as 50 μm, and whose aspect ratio (the ration between the length of the hole and the diameter of the hole) is as low as 2 or 3. Even if the conductive wiring can be formed by the conventional method, but since the conductive paste includes a resin, the conductivity of the wiring is not good. The conventional method can not assuredly form a metal wiring in the fine hole because there may exist non-filled portion inside the hole. Therefore, a novel metal material and production method are required for forming a metal wiring having a superior conductivity.

Meanwhile, micrometer-size particles of various metals, alloys, metal oxides, metal nitrides, metal silicides, or mixtures of these materials, having a spherical shape, are disclosed in U.S. Pat. No. 6,808,568. The micrometer-size particles have a particle size of 1-300 μm.

Further process can be applied to the micrometer-size particles into nanometer-size particles. The applicants of the present invention filed a U.S. provisional application No. 60/836,407, disclosing a nanometer-size spherical particles and the method for producing the particles. According to the method disclosed in the U.S. provisional application No. 60/836,407, spherical particles of various metals or alloys can be produced at a high yield. The sphericity of the nanometer-size particles can be about −10% to +10%.

SUMMARY OF THE INVENTION

It is an object of the present invention to provide a circuit board having a metal wiring formed inside a though hole or non-through hole. The hole can have a diameter of 25 μm or less and an aspect ratio of 5 or more. The though hole or non-through hole metal wiring has a superior conductivity.

In the present invention, there is provided a circuit board comprising a substrate and a metal wiring formed inside a hole formed on the substrate. The metal wiring is made of a solder alloy. The metal wiring is formed by melting solder alloy particles so that the metal wiring includes a polycrystalline region of the solder alloy. The hole can be a through hole or a non-through hole formed on the substrate. The substrate can be a wafer. The circuit board can be a multilayer circuit board.

According to the present invention, the circuit board is prepared as follows: First, a substrate having a hole is provided. The metal particles are made of a solder alloy. The metal particle can include a polycrystalline region. The metal particles have a sphericity of −10% to +10%. The metal particles have a melting point of 100 to 600° C. In another embodiment, the metal particles have a melting point of 100 to 250° C. The metal particles are then molten at a temperature above the melting point. Generally, the temperature for melting can be between the melting point and 10% above the melting point. The molten metal material fills the hole to form a metal wiring inside the hole. The metal particles and the solidified metal wiring inside the hole generally include a polycrystalline region. The metal particles and the solidified metal wiring inside the hole generally have a composite structure. In the present invention, the term "composite structure" means a structure including an amorphous region and a crystalline region homogenously, each amorphous region or crystalline region having a size of 200 nm or less.

The metal materials are made of a solder alloy. The solder alloy useful for the present invention includes a Sn based solder alloy. The solder alloy can be a lead free alloy. The Sn based alloy can include Bi and In. The Sn based alloy can further include Ga. The Sn based alloy can comprise Sn at an amount of 30-85 wt %; Ga at an amount of 0.001 to 3 wt %; Bi at an amount of 15 to 60 wt %; and In at an amount of 0 to 15 wt %.

The metal particles can be micrometer-size spherical particles, having a particle size of 1 to 300 μm, which can be prepared as disclosed by U.S. Pat. No. 6,808,568. When the micrometer-size spherical particles are subjected to the plasma treatment of the present invention, the nanometer-size spherical particles can be formed, having a particle size of less than 1 μm. In one embodiment, the particle size of nanometer-size particles can be 200 nm or less, and in particular, from 1 nm to 200 nm.

The nanometer-size particles of the preset invention can have a composite structure. The spherical particles having the composite structure show improved properties.

The composite structure of the metal particles is maintained when the metal particles are molten at a temperature between the melting point and about 10% higher than the melting point, and therefore, the wiring of the circuit board can include the composite structure. The observation of the cross section of the spherical particles and the wiring can confirm that a composite structure exists. One embodiment can have a composite structure whose grid pattern at intervals is about 0.3 nm. The composite structure has a great influence on material properties. Each amorphous region or crystalline region in the composite structure has a size of 200 nm or less.

The nanometer-size spherical particles have substantially a complete sphericity. The spherical particles have a sphericity of −10% to +10%. Thus, the surface state of the nanometer-size spherical particles is stable; hence, the nanometer-size spherical particles are hardly oxidized and have superior properties as compared to conventional spherical particles.

The spherical particles are useful in manufacturing circuit board having metal wirings for electric or electronic devices.

The micrometer-size spherical particles can be produced by the first steps as explained below. The first step includes producing spherical particles by melting a starting material, feeding the molten starting material onto a dish-shaped disk which is placed in an argon inert atmosphere and rotating at high speed, atomizing the molten starting material into fine droplets with centrifugal force, and then bringing the fine droplets into contact with the inert atmosphere to quench the fine droplets. Thereby prepared particles have a particle size of 1 to 300 μm, and in particular, 1 to 20 μm, having a sphericity of −10% to +10%. The process disclosed in U.S. Pat. No. 6,808,568 can be used for the above first step.

Then, the nanometer-size particles can be produced by the second step of the present invention. The second step includes carrying out a plasma-treatment in which the spherical particles of the micrometer-size particles are bombarded with argon ions in a plasma swirl and brought into contact with a gaseous or vapor component. The spherical particles of the intermediate product are converted so as to have substantially a complete spherical shape. The micrometer-size particles are made of the solder alloy.

An example of the apparatus appropriate for the second step will be described below in detail with reference to the drawings.

In the second step, the micrometer-size particles are bombarded with the argon ions as described above. 90% or more of the spherical particles of the micrometer-size particles can be converted into the nanometer-size particles. The atmosphere for the second step can be an inert gas such as argon.

The plasma-treatment can include two stages: a first stage of producing a first product by bringing the micrometer-size particles into contact with a first gas; and a second stage of producing a second product by bringing the first product into contact with a second gas. The first gas and the second gas can be the same or different. The plasma-treatment is useful in manufacturing the nanometer-size spherical particles at high yield (i.e., 90% or more).

In the present invention, the circuit board can be prepared by the micrometer-size particles, nanometer-size particles, or the mixture thereof.

In the present invention, the shape and the depth of the hole to form the metal wiring is not critical. In one embodiment, the hole can be a through hole and/or non-through hole. The opening of the hole can be shaped into a circle or rectangular. In case of having a circular opening, the opening of the hole has a diameter of 100 µm or less, and in particular, a diameter of 25 µm or less. In case of having a rectangular opening, the opening of the hole has a diameter (width) of 100 µm or less, and in particular, a diameter (width) of 25 µm or less. In the specification, the term "diameter" refers to a width of the opening of the hole whatever shape the opening of the hole has.

DESCRIPTION OF THE PREFERRED EMBODIMENTS

Various lead free solder particles are prepared, and using the lead free solder particles, metal wirings were formed inside holes of a substrate to prepare the circuit boards.

Apparatus for Producing Micrometer-Size Particles

Figure 1:
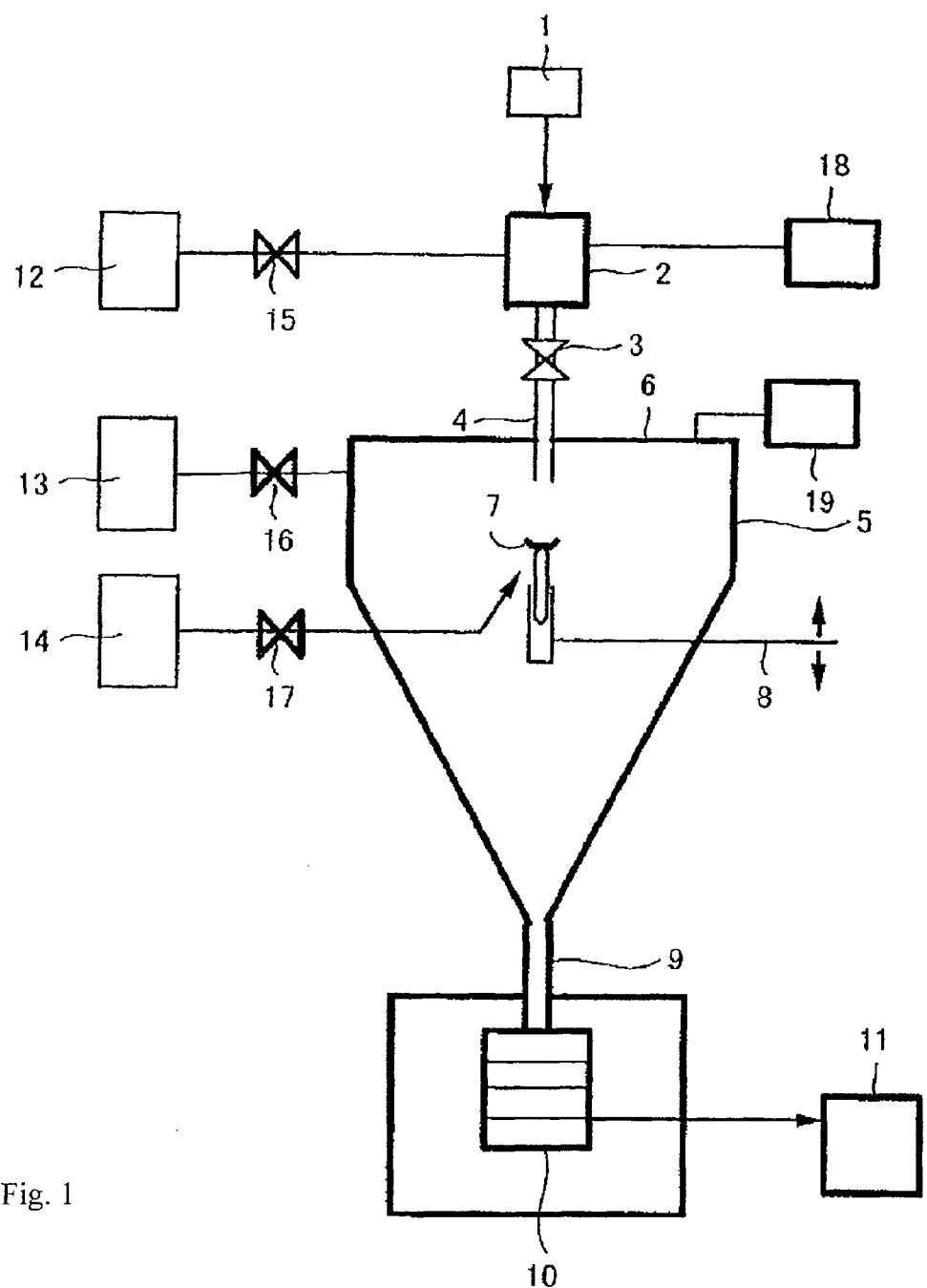
FIG. 1 is schematic view showing a configuration of a centrifugal granulation apparatus for producing micrometer-size particles of the present invention.

FIG. 1 is a schematic view showing a configuration of a centrifugal granulation apparatus which is disclosed in U.S. Pat. No. 6,808,568 owned by the inventors of the present invention. The apparatus is used to produce micrometer-size particles of the present invention.

As shown in FIG. 1, the centrifugal granulation apparatus includes a starting-material supply cylinder 1; an electric oven 2, such as a high-frequency oven, for melting a starting material; a granulation chamber 5; a screening filter 10; and a particle recovery unit 11. The granulation chamber 5 includes a cylindrical section, a cone section located under the cylindrical section, and a lid 6 placed on the cylindrical section. A nozzle 4 extends through the center of the lid 6. A dish-shaped rotary disk 7 is disposed directly under the nozzle 4 and vertically moved with a support unit 8. A discharge pipe 9 for discharging the spherical particles is connected to the lower end of the cone section of the granulation chamber 5. The nozzle 4 connects the electric oven 2 to a high-frequency heater 3 and also connects the high-frequency heater 3 to the granulation chamber 5.

The electric oven 2 is supplied with the starting material from the starting-material supply cylinder 1 for melting the starting material. A first atmosphere gas, stored in a first gas tank 12, is fed to an upper portion of the electric oven 2. A second atmosphere gas and a third atmosphere gas stored in a second gas tank 13 and a third gas tank 14, respectively, are fed to the granulation chamber 5.

The pressure in the electric oven 2 is controlled by using a first valve 15 and a first evacuation unit 18. The pressure in the granulation chamber 5 is controlled using a second valve 16, a third valve 17, and a second evacuation unit 19. If the pressure in the electric oven 2 is maintained slightly higher than atmospheric pressure and the pressure in the granulation chamber 5 is maintained slightly lower than atmospheric pressure, the difference in pressure allows the starting material melted in the electric oven 2 to be fed to the dish-shaped rotary disk 7 through the nozzle 4. The molten starting material fed to the dish-shaped rotary disk 7 is atomized into fine droplets with the centrifugal force of the dish-shaped rotary disk 7 and the fine droplets are solidified into spherical particles by quenching. The spherical particles are fed to the screening filter 10 through the discharge pipe 9 and then screened therewith.

In the first step, the molten starting material is fed onto the dish-shaped rotary disk 7 in an inert atmosphere such as an argon atmosphere and then atomized into fine droplets with centrifugal force and the fine droplets are brought into contact with the inert atmosphere such that the fine droplets are solidified into the spherical particles by quenching.

When a high-speed rotary body has a disk or cone shape, the centrifugal force applied to the molten metal greatly varies depending on a portion of the rotary body to which the molten metal is fed; even-size spherical particles are hardly obtained. However, the molten starting material is fed to an end zone of the dish-shaped rotary disk 7 having a concaved portion and therefore the constant centrifugal force of the end zone thereof is applied to the molten starting material; hence, the formed fine droplets are even in size. The fine droplets are quenched in a mixture of the second and third gases and therefore solidified into the spherical particles, which are then collected. The second and third gases can be argon.

The granulation of the molten metal has been investigated using an apparatus similar to the centrifugal granulation apparatus. The investigation has shown that droplets of the melt are solidified into fine particles having a composite structure by quenching and the fine particles are self-assembled such that the fine components are isolated from each other with inclusions or cavities depending on the composition of a starting material and/or the type of an atmosphere gas used. The term "self-assembling" means that uniform molten metal automatically forms a composite structure during atomization and solidification of the present invention.

As increasing the rotational speed of the dish-shaped rotary disk 7, the size of the obtained spherical particles is reduced. When the dish-shaped rotary disk 7 has a diameter of 35 mm and a depth of 5 mm, the rotational speed thereof can be 30,000 rpm or more to obtain spherical particles having an average size of 1-300 nm.

Apparatus for Producing Nanometer-Size Particles

Figure 2:
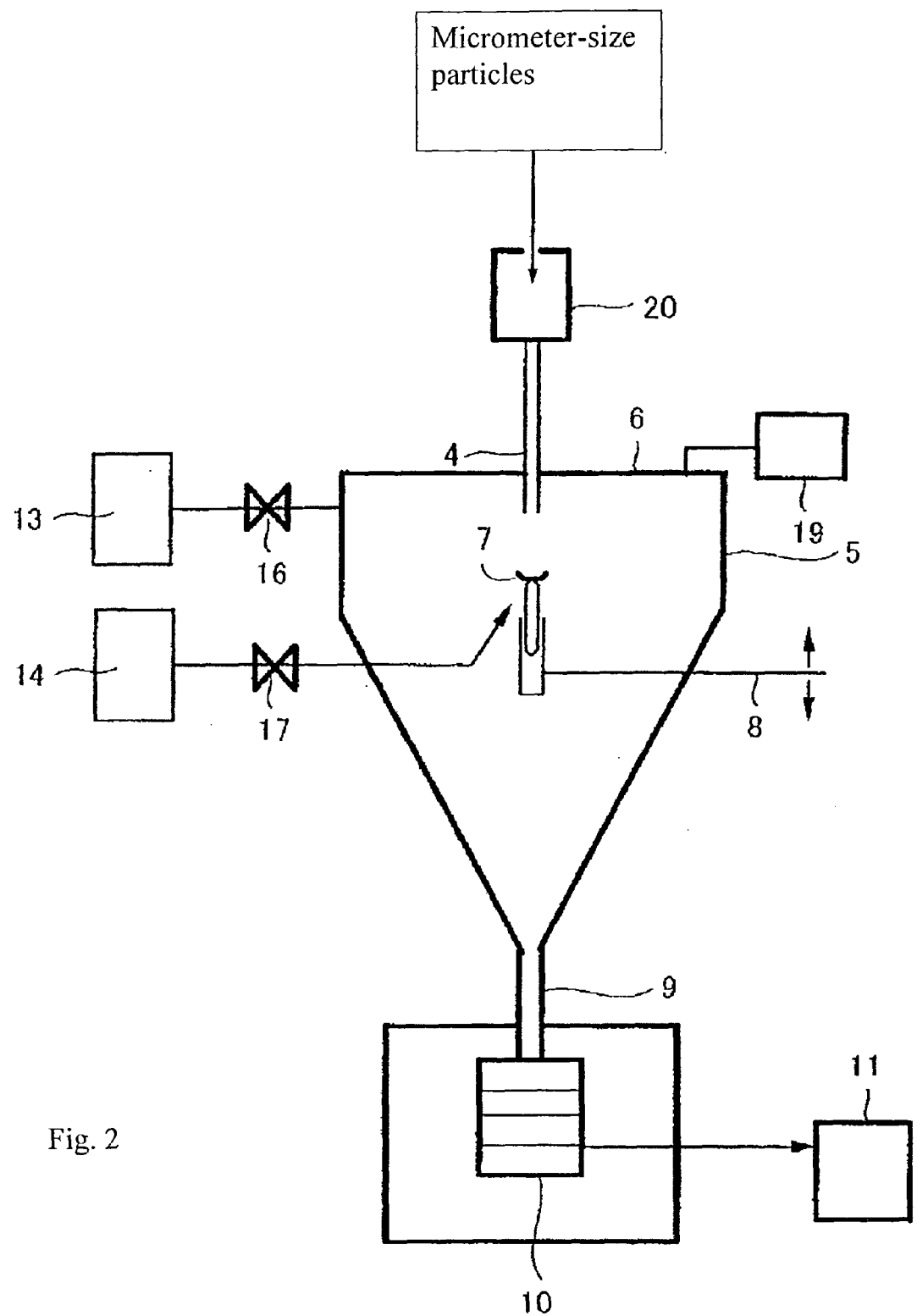
FIG. 2 is a schematic view showing a configuration of an apparatus for producing nanometer-size particles of the present invention.

FIG. 2 shows an apparatus for producing nanometer-size particles. The apparatus shown in FIG. 2 has substantially the same configuration as that of the centrifugal granulation apparatus shown in FIG. 1 except that this apparatus has the plasma reaction unit 20 instead of the electric oven 2.

Figure 3:
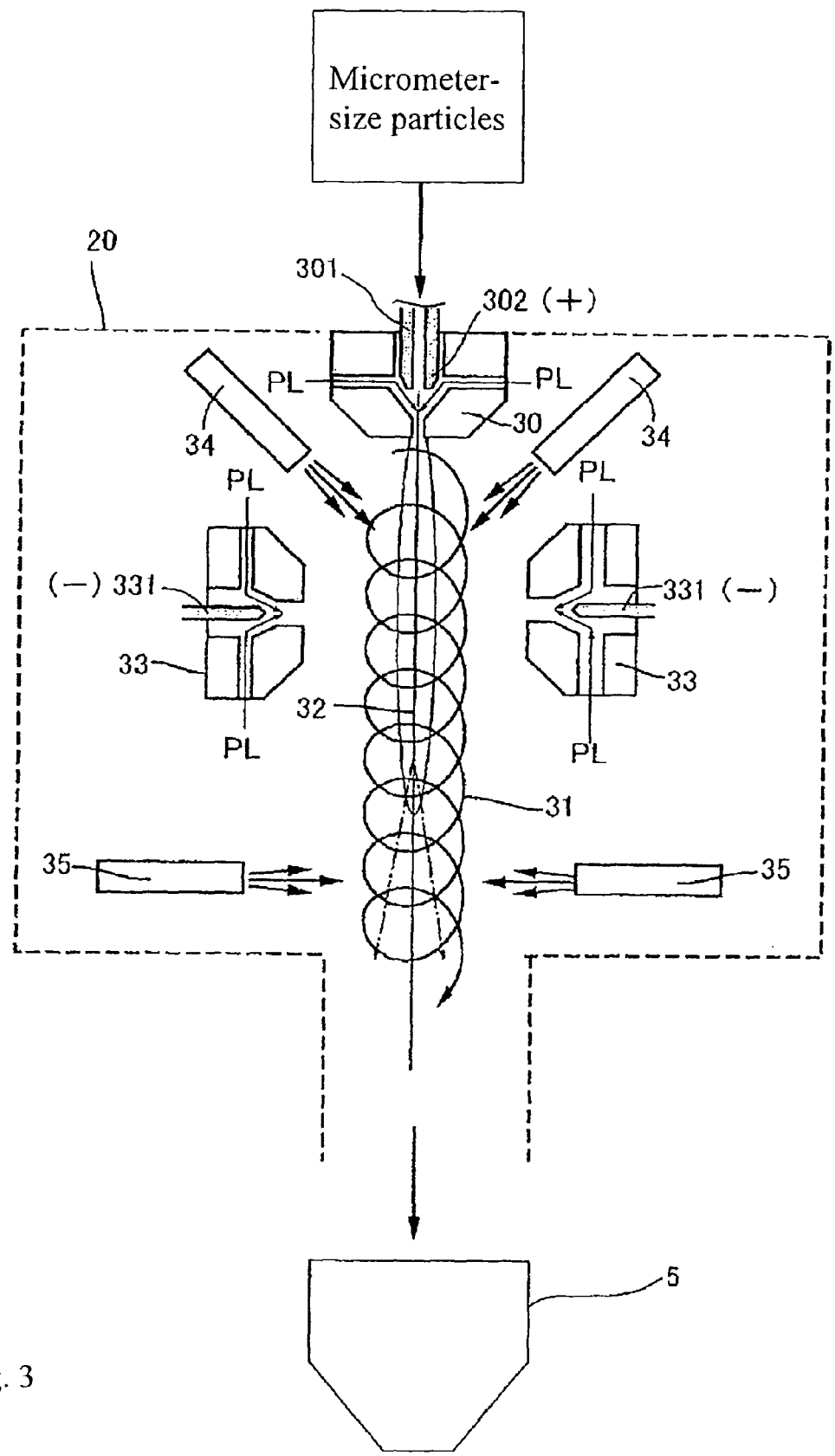
FIG. 3 is schematic view showing a configuration of a plasma treatment unit included in the apparatus shown in FIG. 2.
Figure 4:
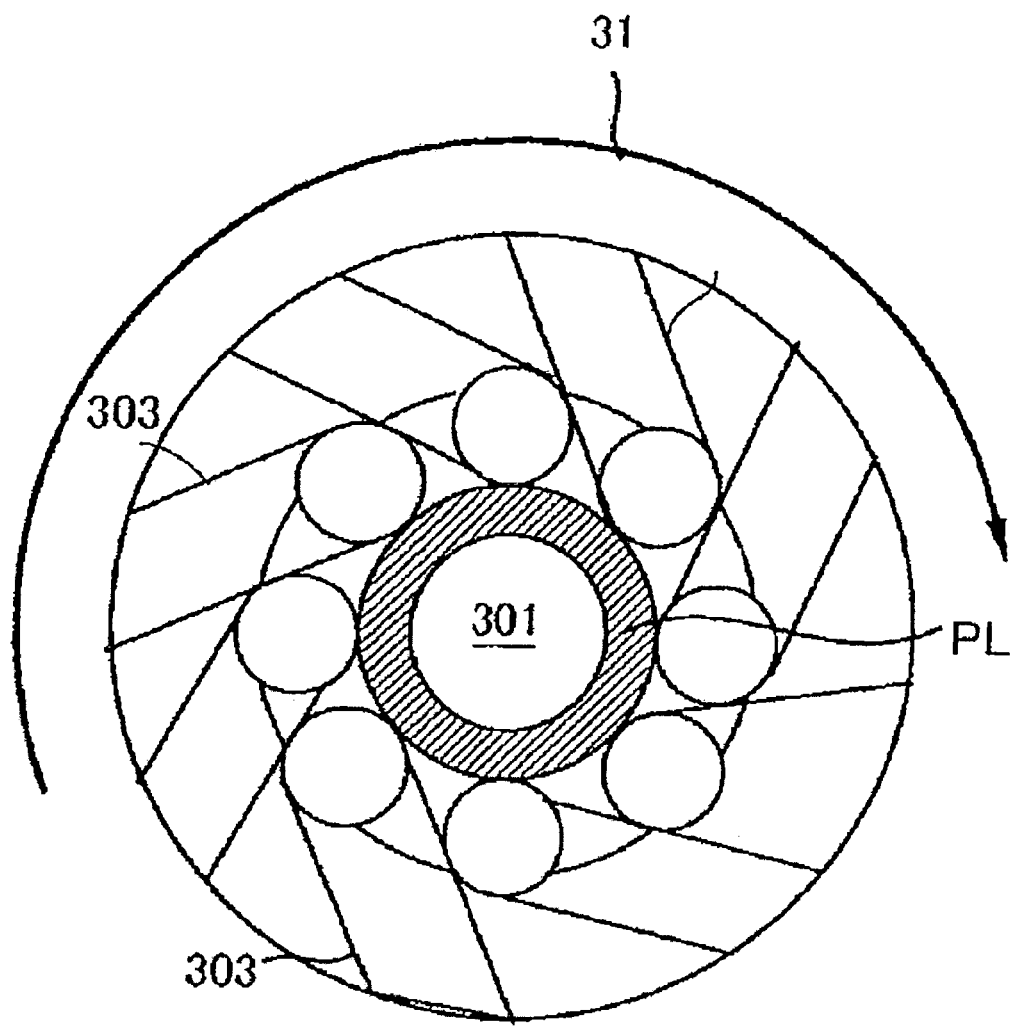
FIG. 4 is an enlarged view of a part of the plasma reaction unit shown in FIG. 3.

FIG. 3 is a schematic view showing a configuration of the plasma reaction unit 20. The plasma reaction unit 20 is used to bombard the micrometer-size particles, obtained in the first step, with argon ions in a plasma swirl to from the nanometer-size spherical particles as well as to bring the spherical particles into contact with a gaseous component to subject the spherical particles to plasma-enhanced crystallization. This treatment can make the spherical particles having a sphericity of 10% or less. As shown in FIG. 3, the plasma reaction unit 20 includes a principal torch 30, an auxiliary torch 33, a first reaction gas supply unit 34, and a second reaction gas supply unit 35.

The principal torch 30 includes a first plasma gas supply unit for supplying a plasma gas PL, a first-product supply unit 301 for supplying the micrometer-size particles, and an anode 302. The auxiliary torch 33 includes a second plasma gas supply unit for supplying the plasma gas PL and a cathode 331. When plasma is generated between the anode 302 and the cathode 331, flows of the plasma gas PL are discharged from the first and second plasma gas supply unit and intersect with each other. Since the plasma gas PL is electrically conductive, a conductive path extending from the tip of the auxiliary torch 33 to the tip of the principal torch 30 is formed.

The micrometer-size particles are fed to the first-product supply unit 301 and then discharged therefrom along a central axis 32. In this operation, an inert gas such as argon is discharged from the first gas supply unit 34 simultaneously with the feed of the micrometer-size particles. The inert gas flows along the central axis 32 and serves as a protective gas. Hence, the micrometer-size particles are prevented from being scattered and therefore can be treated at a rate close to 100%. As shown in FIG. 3 in an enlarged manner, the plasma gas PL forms a plasma gas flow 31, which travels around the central axis 32. The feed rate of the micrometer-size particles can be 1 to 30 L/min.

After the micrometer-size particles are subjected to a first plasma reaction as described above, a second plasma reaction is applied with the second reaction gas supply unit 35.

A gas used in this step can be argon. The feed rate of the reaction gas can be 1 to 30 L/min.

Thereby treated micrometer-size particles are fed to a granulation chamber 5 and then subjected to granulation as described above with reference to FIG. 1, so as to produce nanometer-size particles.

EXAMPLES

Examples 1 to 12

Various solder alloys including indium (In), tin (Sn), gallium (Ga) and bismuth (Bi) were treated by the apparatus as shown in FIG. 1, to prepare various lead free micrometer-size particles. The pressure inside the electric oven 2 was set to be $9 \times 10^{-2}$ Pa or less. The pressure inside the granulation chamber 5 was set to be 14.699 psi±1%, and filled with an atmospheric gas including oxygen at a concentration of 0.3 to 0.7 ppm at a temperature of 5° C. or less. The dish-shaped rotary disk 7 had a diameter of about 35 mm and a depth of about 5 mm.

The solder alloy was fed to an electric oven 2 included in the centrifugal granulation apparatus, thereby melting the solder alloy. The molten solder alloy passed through a nozzle 4 to reach a granulation chamber 5. In the granulation chamber 5, the molten solder alloy was fed onto a dish-shaped rotary disk 7 and then atomized into droplets with the centrifugal force created by the high-speed rotation of the dish-shaped rotary disk 7 and the droplets were quenched. The formed spherical particles having a composite structure were obtained. In this step, argon was used and the pressure in the granulation chamber 5 was about 0.3 MPa.

Figure 5:
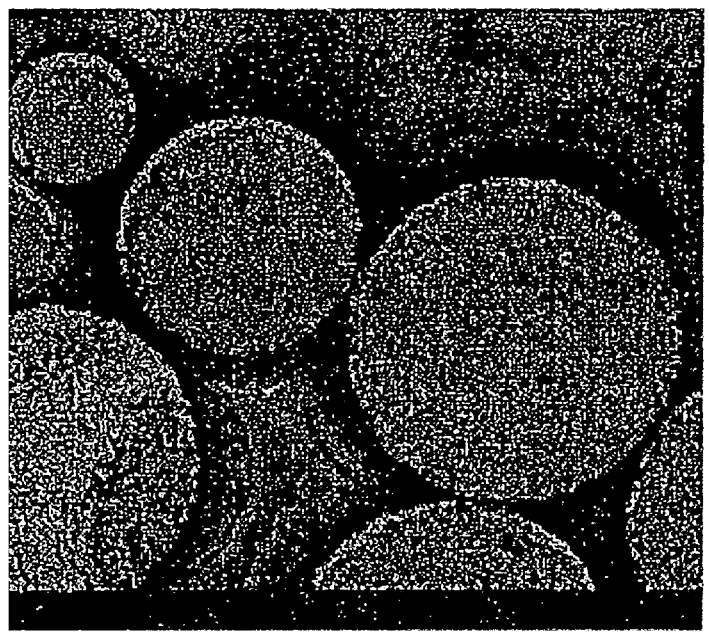
FIG. 5 is an image of micrometer-size particles, shown in cross section, produced in Example 1, the image being taken with a scanning electron microscope (SEM) and being hereinafter referred to as a SEM image.

The micrometer-size particles as obtained had an averaged particle size of about 15 μm. FIG. 5 is a SEM image of the micrometer-size particles shown in cross section. FIG. 5 illustrates that amorphous metal regions are homogeneously present in the spherical particles. This confirms that the spherical particles had a composite structure.

Thereby prepared lead free solders as Examples 1 to 9 are summarized in Table 1.

Example 13

A starting material containing indium (In), tin (Sn), gallium (Ga), and bismuth (Bi) was subjected to the apparatus as shown in FIG. 1, so as to prepare micrometer-size particles, as the same manner as Examples 1 to 13. In Example 13, the micrometer-size particles were further subjected to the apparatus shown in FIG. 2. Argon was used as a gas.

Thereby obtained lead free solder as Example 13 has a composition of Bi: 25.33 wt %, In: 6.17 wt %, Ga: 0.78 wt % and Sn: 67.72 wt %. The lead free solder as Example 13 is of fine spherical particles having a particle size of 100 to 200 nm and a sphericity of about −1% to +1%.

Figure 6:
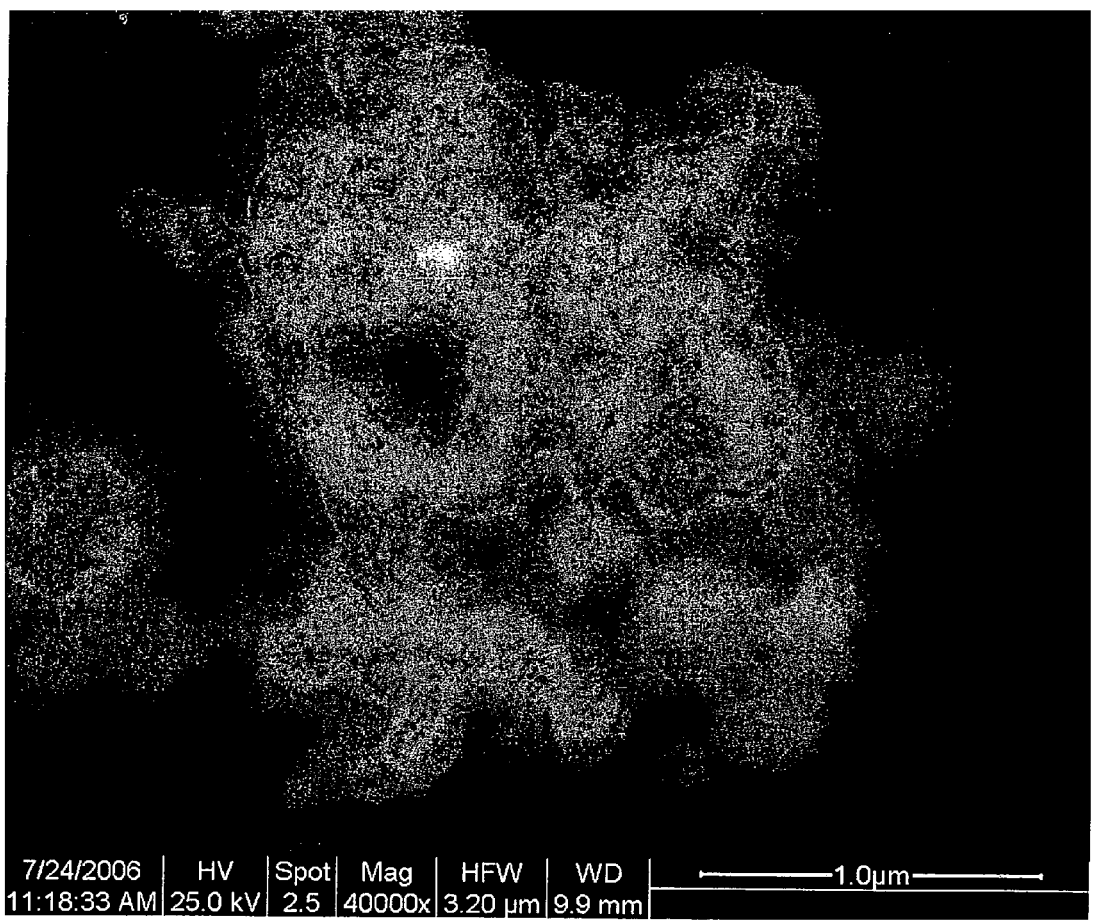
FIG. 6 is a SEM image of nanometer-size particles produced in Example 13.

FIG. 6 is a SEM image of the lead free solder as Example 13. FIG. 6 illustrates that the fine particles has a spherical shape.

Comparative Examples 1-12

Various micrometer-size particles of lead free solder alloy were prepared by melting starting metal materials under the atmospheric circumstance, using a stainless steel vessel. The starting material was heated at a temperature of 250 to 300° C. The compositions of Comparative Examples 1 to 9 are summarized in Table 1 below.

Method for Preparing Circuit Board

Figure 11:
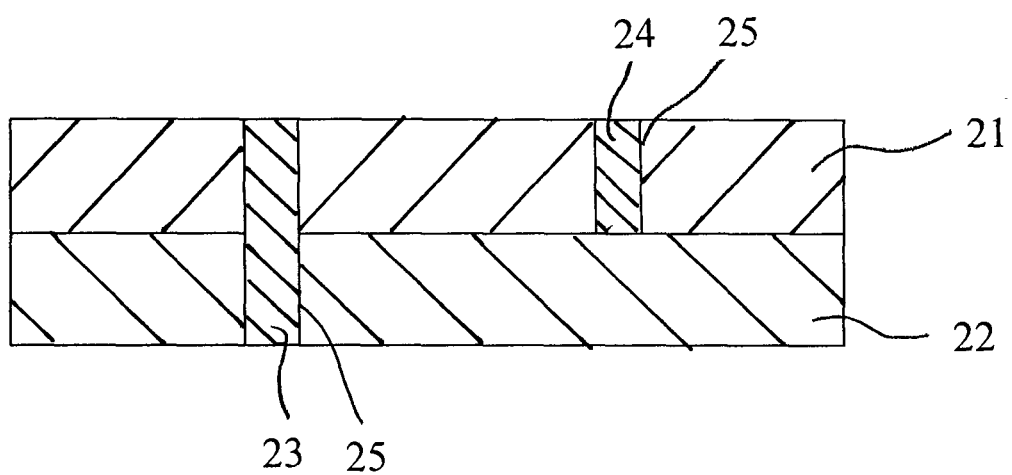
FIG. 11 is a cross-sectional view of a multilayer circuit board of the present invention.

An insulating substrate is provided. On the insulating substrate, a non-through hole having a diameter of 23 μm and aspect ration (depth/diameter) of about 7 was formed. The substrate was put into a chamber, and the pressure of the inside chamber was reduced into 0.2 Pa. The particles as prepared in accordance with Examples 1-13 and Comparative Examples 1-12 were used. The particles were molten at a temperature 5% higher than the melting point. For example, the particles of Example 1 were heated at about 126° C. in a melting pot. The substrate was applied to supersonic wave of 55 to 65 kHz. The molten metal was poured into the hole. Then, the reduced pressure was recovered and the pressure inside the chamber was increased into atmospheric pressure. The supersonic wave was continued for 5 minutes. The molten metal was solidified by cooling. FIG. 11 illustrates a multilayer circuit board including layers 21, 22, having holes 25, 25 in which wirings 23, 24 are provided.

Figure 7:
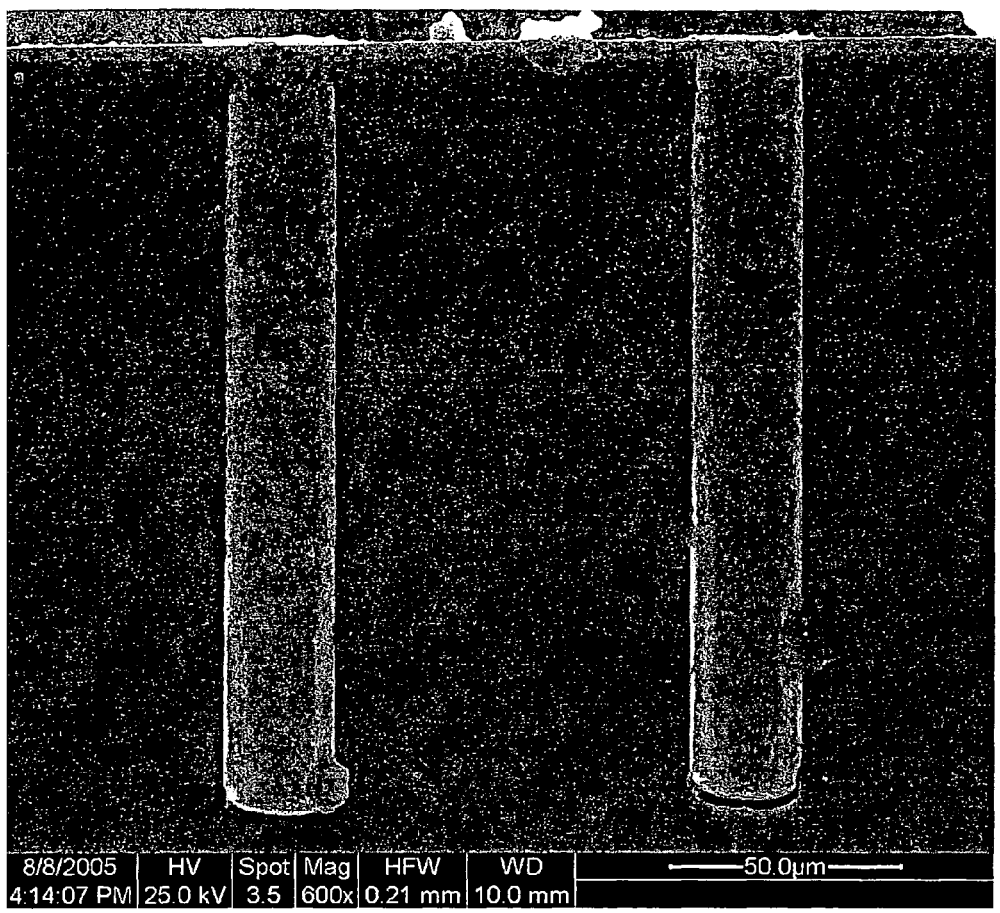
FIG. 7 is an image of a wiring board, shown in cross section, produced in Example 13, the image being taken with a scanning electron microscope (SEM)
Figure 8:
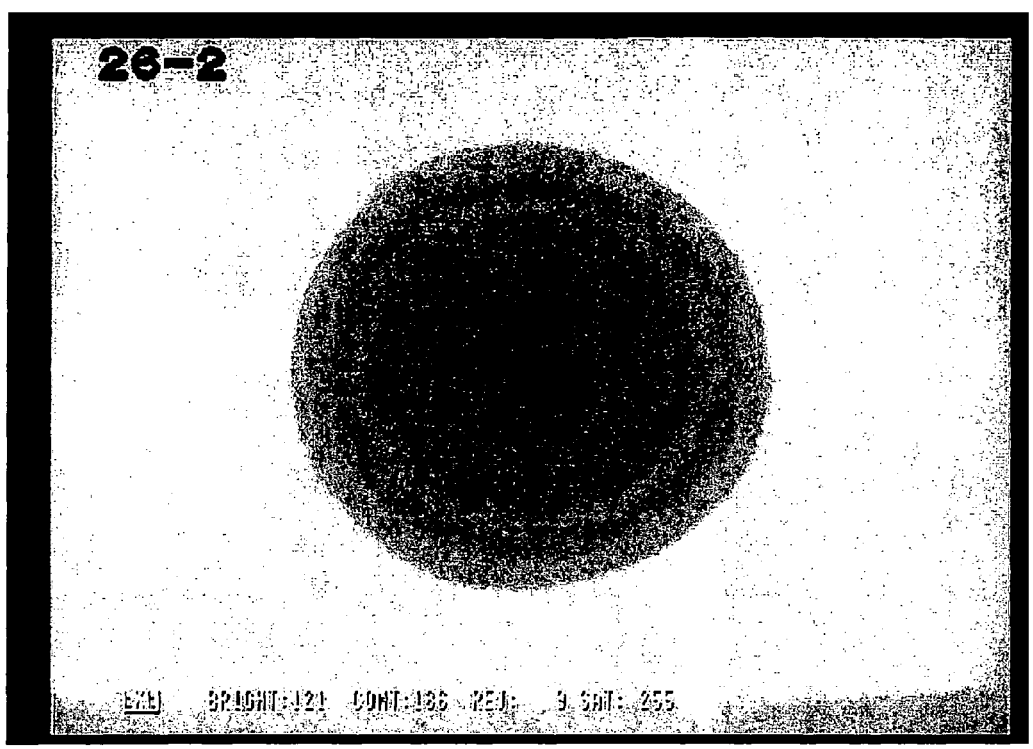
FIG. 8 is an X-ray image of a wiring board, shown in cross section of a wiring formed in a hole, produced in Example 13.
Figure 9:
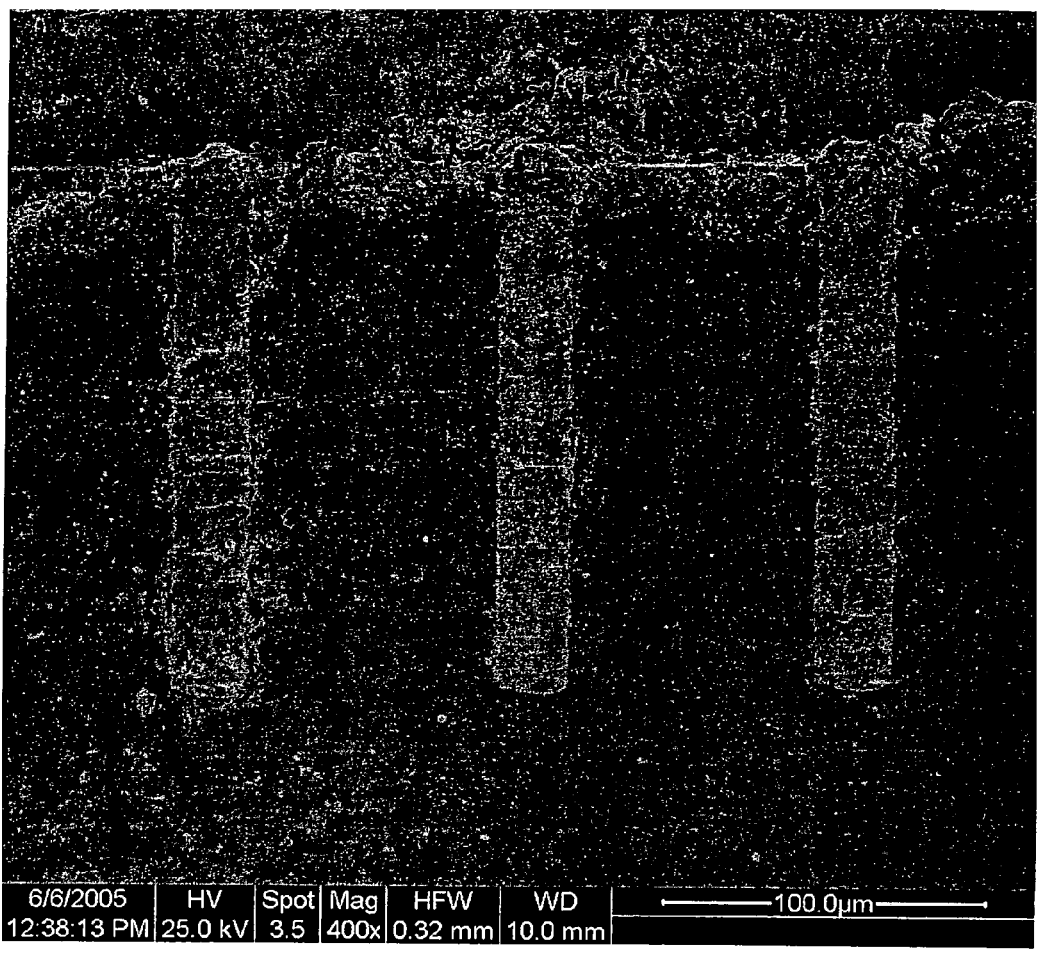
FIG. 9 is an image of a wiring board, shown in cross section, produced in Comparative Example 9, the image being taken with a scanning electron microscope (SEM)
Figure 10:
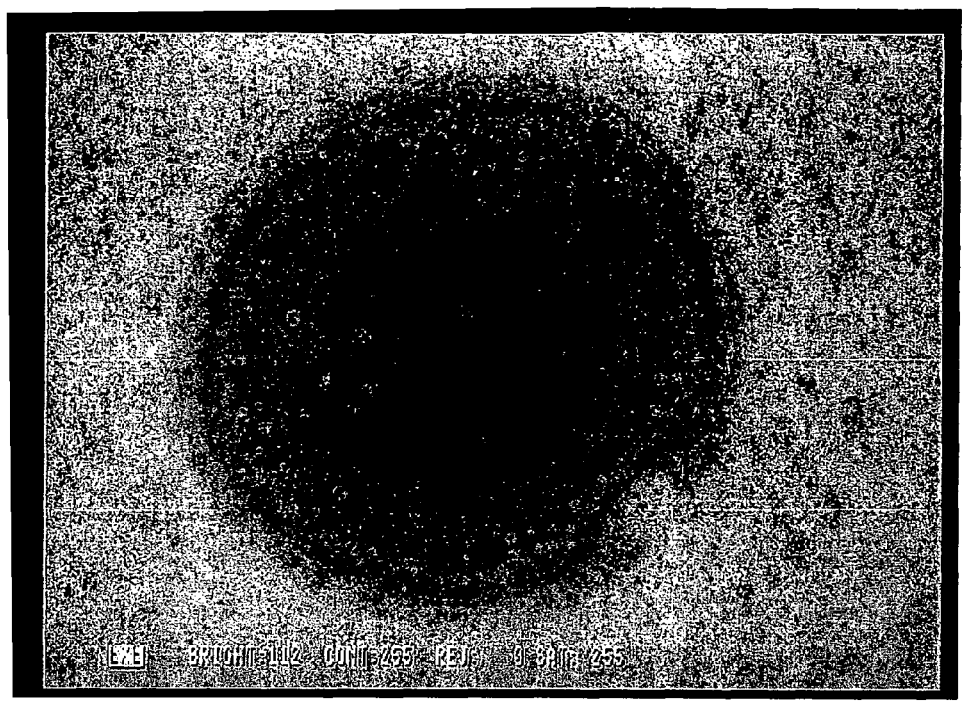
FIG. 10 is an X-ray image of a wiring board, shown in cross section of a wiring formed in a hole, produced in Comparative Example 9.

FIGS. 7 and 9 are SEM images of the cross section of the wiring boards, prepared by using Examples 13 and Comparative Example 9, respectively. FIGS. 8 and 10 are X-ray images of the metal wiring formed inside the holes, prepared by Example 13 and Comparative Example 9, respectively.

Comparing FIG. 8 with FIG. 10, the voids including the metal wiring formed by using Example 13 were much less than those by using Comparative Example 9.

The conductivity was measured with respect to the metal wirings by using Examples and Comparative Examples. The results are summarized in Table 1. In one embodiment, the conductivity of the metal wiring of the present invention can be less than 100 μΩcm, and in another embodiment, the conductivity of the metal wiring of the present invention can be from 1 μΩcm to 30 μΩcm, and in yet another embodiment, the conductivity of the metal wiring of the present invention can be from 5 μΩcm to 20 μΩcm.

From the results of the X-ray images and the conductivity, the metal wiring of the present invention was found that it has superior conductivity compared with the ones by using conventional metal particles.

TABLE 1

| | Bi wt % | In wt % | Ga wt % | Sn wt % | Melting point ° C. | Conductivity μΩ cm | Note |
|---|---|---|---|---|---|---|---|
| Example 1 | 58 | 10 | 0.001 | 31.999 | 120 | 15.2 | |
| Example 2 | 28 | 3 | 0.001 | 68.999 | 160 | 9.3 | |
| Example 3 | 20 | | 0.001 | 79.999 | 200 | 8.2 | |
| Example 4 | 58 | 10 | 2 | 30 | 120 | 15.4 | |
| Example 5 | 28 | 3 | 2 | 67 | 160 | 9 | |
| Example 6 | 20 | | 2 | 78 | 200 | 8.1 | |
| Example 7 | 28 | 3 | 0.01 | 68.99 | 160 | 8.7 | |
| Example 8 | 28 | 3 | 0.1 | 68.9 | 160 | 8.5 | |
| Example 9 | 28 | 3 | 1 | 68 | 160 | 8.6 | |
| Comparative Example 1 | 58 | 10 | 0.001 | 31.999 | 120 | 190.1 | Melt in atmosphere. |
| Comparative Example 2 | 28 | 3 | 0.001 | 68.999 | 160 | 185.1 | Melt in atmosphere. |
| Comparative Example 3 | 20 | | 0.001 | 79.999 | 200 | 180.2 | Melt in atmosphere. |
| Comparative Example 4 | 58 | 10 | 2 | 30 | 120 | 190.5 | Melt in atmosphere. |
| Comparative Example 5 | 28 | 3 | 2 | 67 | 160 | 185.1 | Melt in atmosphere. |
| Comparative Example 6 | 20 | | 2 | 78 | 200 | 165.1 | Melt in atmosphere. |
| Comparative Example 7 | 28 | 3 | 0.01 | 68.99 | 160 | 170.2 | Melt in atmosphere. |
| Comparative Example 8 | 28 | 3 | 0.1 | 68.9 | 160 | 175.5 | Melt in atmosphere. |
| Comparative Example 9 | 28 | 3 | 1 | 68 | 160 | 185.1 | Melt in atmosphere. |
| Example 10 | 58 | 10 | | 32 | 120 | 15.3 | |
| Example 11 | 28 | 3 | | 69 | 160 | 9 | |
| Example 12 | 20 | | | 80 | 200 | 8.2 | |
| Comparative Example 9 | 58 | 10 | | 32 | 120 | 185.1 | Melt in atmosphere. |
| Comparative Example 10 | 28 | 3 | | 69 | 160 | 190.1 | Melt in atmosphere. |
| Comparative Example 11 | 20 | | | 80 | 200 | 185.1 | Melt in atmosphere. |
| Example 13 | 25.33 | 6.17 | 0.78 | 67.72 | 170 | 8 | |

What is claimed is:

1. A circuit board, comprising;
   a substrate having a hole having a diameter of 23 μm or less, and an aspect ratio of 5 or more; and
   a wiring formed inside the hole, wherein the wiring is made of a lead free solder alloy having a melting point of 100 to 600° C., the solder alloy consisting of tin (Sn), bismuth (Bi), indium (In) and gallium (Ga),
   wherein the wiring includes a polycrystalline region of the solder alloy, the wiring includes little voids,
   wherein the tin (Sn) is included in the solder alloy at 30 to 80 wt %, and the bismuth (Bi) is included in the solder alloy at 20 to 58 wt %, and indium (In) is included in the solder alloy at 3 to 10 wt %, and gallium (Ga) is included in the solder alloy at 0.001 to 1 wt %.

2. A circuit board according to claim 1, wherein the hole is a through hole or a non-through hole formed on the substrate.

3. A circuit board according to claim 1, wherein the substrate is a wafer.

4. A circuit board according to claim 1, wherein the wiring is formed by melting metal particles to fill the hole under a reduced pressure.

5. A circuit board according to claim 1, wherein the solder alloy is a Sn based lead free alloy.

6. A circuit board according to claim 1, wherein the diameter is 23 μm.

7. A circuit board according to claim 1, wherein the tin (Sn) is included in the solder alloy at 30 to 85 wt %, and the bismuth (Bi) is included in the solder alloy at 15 to 60 wt %.

8. A circuit board according to claim 1, wherein the tin (Sn) is included in the solder alloy at 30 to 85 wt %, and the bismuth (Bi) is included in the solder alloy at 15 to 60 wt %, and gallium (Ga) is included in the solder alloy at 0.001 to 3 wt %.

* * * * *